(12) United States Patent
Fujita

(10) Patent No.: US 6,794,722 B2
(45) Date of Patent: Sep. 21, 2004

(54) FIELD EFFECT TRANSISTOR WITH REVERSE DOPANT GRANDIENT REGION

(75) Inventor: Koichi Fujita, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/315,025

(22) Filed: Dec. 10, 2002

(65) Prior Publication Data

US 2004/0004258 A1 Jan. 8, 2004

(30) Foreign Application Priority Data

Jul. 5, 2002 (JP) .......................................... 2002-197454

(51) Int. Cl.[7] .............................................. H01L 29/94
(52) U.S. Cl. ........................................ 257/386; 257/368
(58) Field of Search .............................. 257/347, 408, 257/402, 386, 368

(56) References Cited

U.S. PATENT DOCUMENTS

| | | | | | |
|---|---|---|---|---|---|
| 5,801,426 | A | * | 9/1998 | Okamura | 257/386 |
| 6,287,901 | B1 | * | 9/2001 | Christensen et al. | 438/162 |
| 2002/0020876 | A1 | * | 2/2002 | Hirano et al. | 257/347 |
| 2003/0089948 | A1 | * | 5/2003 | Min | 257/347 |
| 2003/0178678 | A1 | * | 9/2003 | Wei et al. | 257/347 |
| 2003/0205759 | A1 | * | 11/2003 | Christensen et al. | 257/347 |

FOREIGN PATENT DOCUMENTS

| | | |
|---|---|---|
| JP | 57-104259 | 6/1982 |
| JP | 9-252127 | 9/1997 |

OTHER PUBLICATIONS

S. Wolf. Silicon Processing for the VLSI Era Vol.–1Process Technology. 1986. Lattice Press, pp. 295–297.*

Shindo, M., et al., "High Power LDMOS for Cellular Base Station Applications", Proceeding of ISPSD 2001, pp. 107–110.

Trivedi, Malay, et al. "Performance Modeling of RF Power MOSFET's", IEEE Transactions on Electron Devices, vol. 46, No. 8, Aug. 1999, pp. 1794–1801.

* cited by examiner

Primary Examiner—Eddie Lee
Assistant Examiner—Douglas W. Owens
(74) Attorney, Agent, or Firm—Leydig, Voit & Mayer, Ltd.

(57) ABSTRACT

A $p^{--}$-type impurity layer is provided at a position located below $n^-$-type impurity layers which are to become the drain of a MOSFET. Although the $p^{--}$-type impurity layer is of the same conductivity type as a semiconductor substrate, the $p^{--}$-type impurity layer is lower in doping level than the semiconductor substrate. The $p^{--}$-type impurity layer is formed so as to be joined to an $n^-$-type impurity layer and such that the dosage of p-type impurity (i.e., the amount of included impurity) becomes higher with increasing distance from the thus-formed junction. The dosage of the area located in the vicinity of the junction is made lower, thereby rendering a depletion layer easy to spread when a drain voltage is applied. Thus, capacitance Cds developing between the drain and the substrate is reduced, and the operating speed of the MOSFET increases. Further, the structure of the MOSFET reduces fluctuations in the capacitance Cds stemming from fluctuations in the drain voltage, thereby suppressing power leakage and improving output efficiency.

13 Claims, 8 Drawing Sheets

FIELD EFFECT TRANSISTOR WITH REVERSE DOPANT GRANDIENT REGION

BACKGROUND OF THE INVENTION

1. Field of the Invention

The invention relates to a semiconductor device, more particularly, a metal oxide semiconductor field-effect transistor (MOSFET) which operates at high frequency.

2. Background Art

FIG. 13 is a cross-sectional view showing the structure of a typical MOSFET. The MOSFET is formed on a lightly-doped p-type (p⁻-type) silicon substrate 1. A lightly-doped n-type (n⁻-type) impurity layer 2 is formed on the substrate 1 in a region where a drain is to be formed. Further, a heavily-doped n-type (n⁺-type) impurity layer 3 is formed on the substrate 1 in a region where a source is to be formed and in another region where a drain is to be formed.

FIG. 14 is a view for describing the capacitance Cds of the drain region when a drain voltage is applied to the MOSFET. When a drain voltage Vds is applied to the MOSFET, a depletion layer is formed between a junction between the n⁻-type impurity layer 2 and the p⁻-type silicon substrate 1, indicated as a hatched portion in the drawing. Since the depletion layer acts as a dielectric, a capacitance Cds arises in a junction between the n⁻-type impurity layer 2 and the p⁻-type silicon substrate 1. As the drain voltage increases, the thickness of the depletion layer increases. Thus, in general, as the drain voltage increases, the capacitance Cds becomes smaller.

The capacitance of a drain region becomes a factor for decreasing the operating speed of the MOSFET. Hence, the capacitance must be minimized. In particular, in the case of the MOSFET which operates at high frequency, an interval Lgd (see FIG. 13) between the gate and the drain must be made comparatively longer in order to increase the withstand voltage characteristic. For this reason, the capacitance of a junction between a substrate and a drain region tends to increase. If the capacitance Cds increases, an output voltage leaks to the p⁻-type silicon substrate 1 and drops with an increase in operating frequency, thereby deteriorating power efficiency. In terms of an increase in operating speed and output efficiency, a reduction in the capacitance of the drain region is an important problem.

A relationship between the capacitance of a drain region in a high-frequency MOSFET and output power thereof is described in a paper edited by Maylay Trivedi et. al. entitled "Performance Modeling of RF Power MOSFETs" (IEEE Transactions on Electron Device, Vol. 45, No. 8, August 1999, pp. 1794 to 1801). In the paper, a relationship between power $P_0$ output from the MOSFET and parasitic capacitance $C_{oss}$ between the source and drain regions is expressed as Eq. (1) provided below; namely, $$P_0 = V_{IN}^2 gm^2 R_L / \{2 \cdot (1 + \omega^2 C_{oss}^2 R_L^2)\} \qquad (1)$$

where $V_{IN}$ is an input voltage, $\omega$ is mutual conductance; $R_L$ is a frequency; and $R_L$ is load resistance.

According to Eq. (1), $P_0$ becomes higher as the parasitic capacitance $C_{oss}$ becomes smaller.

The capacitance can be diminished by means of shortening the interval Lgd. However, as mentioned previously, the interval Lgd affects the withstand voltage characteristic of the MOSFET, and therefore shortening of the interval Lgd is not preferable. In other words, in relation to design of a high-frequency MOSFET, a tradeoff exists between an increase in a withstand voltage characteristic and an increase in the operating speed and output efficiency.

SUMMARY OF THE INVENTION

The invention aims at increasing an operating speed and output efficiency without involvement of a decrease in the withstand voltage characteristic of a high frequency MOSFET. To achieve the object, the present invention proposes two types of structures as the structure of a semiconductor device.

According to one embodiment of the present invention, a semiconductor device includes a semiconductor substrate of first conductivity type, an impurity region of second conductivity type which is formed as a source or drain of the semiconductor device in a surface of the semiconductor substrate and has a polarity opposite that of the semiconductor substrate, and an impurity region of first conductivity type formed below the impurity region of second conductivity type that is formed as the drain, so as to be joined to the impurity region of second conductivity type. The impurity region of first conductivity type is formed directly in the semiconductor substrate. Further, the quantity of impurity contained in the impurity region of first conductivity type increases with increasing distance from the junction of the impurity region of second conductivity type.

By means of such a structure, when a drain voltage is applied to the device, a depletion layer of a junction is rendered easy to spread, because doping profile in a depth-wise direction is set such that a doping level increases gently.

According to another embodiment of the present invention, a semiconductor device includes a semiconductor substrate of first conductivity type, an impurity region of second conductivity type which is formed as a source or drain of a semiconductor device on the surface of the semiconductor substrate, and an oxide film layer formed below the impurity region of second conductivity type that is formed as the drain, so as to be joined to the impurity region of second conductivity type.

By means of such a structure, no p-n junction is present at a position located below the impurity region formed as a drain. Hence, the capacitance stemming from application of a drain voltage can be made small. Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which.

DETAILED DESCRIPTION OF THE PREFERRED EMBODIMENTS

Preferred embodiments of the invention will be described hereinbelow by reference to the drawings.

First Embodiment

A structural feature of a MOSFET according to a first embodiment will be apparent thorough an explanation for a process for manufacturing a MOSFET described below. FIGS. 1A, 1B, 1C, 1D, and 1E are views showing the cross section of a MOSFET in primary steps during the course of manufacture of a MOSFET.

Figure 1A:
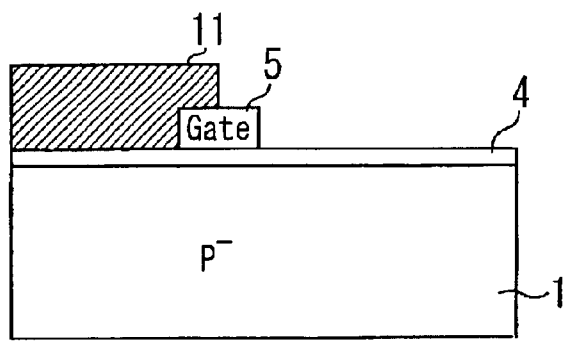
FIGS. 1A, 1B, 1C, 1D, and 1E show a manufacturing process for a MOSFET according to a first embodiment of the present invention.

As shown in FIG. 1A, a gate oxide film 4 is formed on a lightly-doped p-type ($p^-$-type) silicon substrate 1. A gate electrode 5 is formed on the gate oxide film 4. Next, a resist pattern 11 is formed so as to cover an area in which a source region is to be formed and a portion of a gate electrode close to the source region.

Figure 1B:
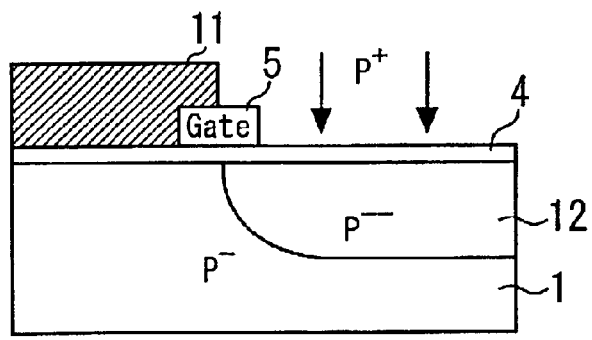

As shown in FIG. 1B, a low-dose n-type impurity is implanted into the area of the silicon substrate 1 which is not covered with the resist pattern 11. In the embodiment, phosphorus (P) is implanted as the n-type impurity, and the dosage of phosphorus is set to 1 to $5E11/cm^2$ or thereabouts. The doping level must be set to a level at which the polarity of the $p^-$-type silicon substrate 1 is not inverted. As illustrated, a more-lightly-dose p-type ($p^{---}$-type) impurity layer 12 is formed in the $p^-$-type silicon substrate 1.

Figure 1C:
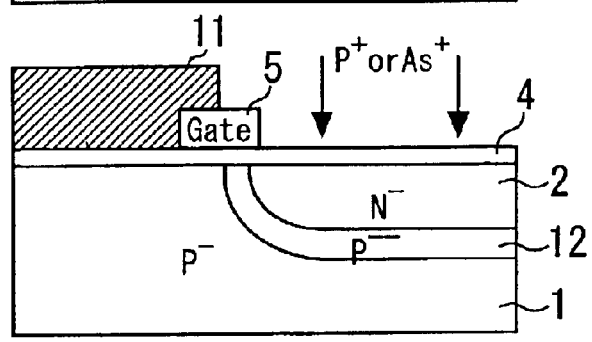

As shown in FIG. 1C, phosphorus is further implanted into the area in which phosphorus has already been implanted in the step shown in FIG. 1B. Here, another n-type impurity, such as arsenic (As), may be implanted in place of phosphorus. At this time, the dosage of impurity is made less than that employed in the step shown in FIG. 1B. In the embodiment, the doping level is set to 1 to $10E12/cm^2$ or thereabouts. As illustrated, a lightly-doped n-type ($n^{-1}$-type) impurity layer 2 is formed in the $p^{---}$-type impurity layer 12 so as become shallower than the $p^{---}$-type impurity layer 12.

Figure 1D:
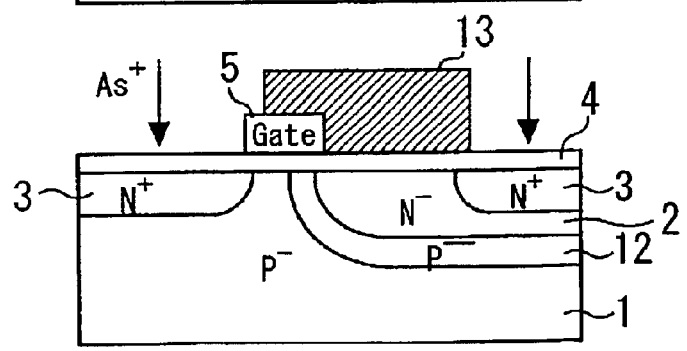

As shown in FIG. 1D, the resist pattern 11 is removed, and a resist pattern 13 is newly formed so as to cover the drain region and a portion of the gate electrode close to the drain region. Arsenic is implanted as an n-type impurity into the area of the wafer which is not covered with the resist pattern 13, thereby forming a highly-doped n-type ($n^+$-type) impurity layer 3.

Figure 1E:
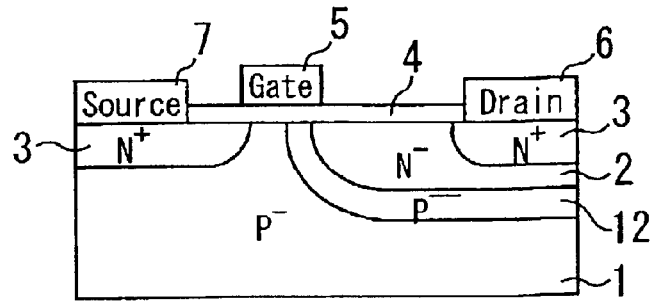

Finally, the resist pattern 13 is removed, thereby completing the drain electrode 6 and the source electrode 7, as shown in FIG. 1E. The MOSFET of the embodiment is completed through the foregoing process. The structure of the MOSFET is characterized in that the $p^{---}$-type impurity layer 12 exists immediately below the $n^-$-type impurity layer 2. In other words, the dosage of the portion of the $p^-$-type silicon substrate 1 located immediately below the $n^-$-type impurity layer 2 has become particularly low. The objective of the invention is to reduce parasitic capacitance developing between the drain and the silicon substrate. Therefore, only the drain region is imparted with such a layer structure. By means of such a structure, a doping level in the junction between the $n^-$-type impurity layer 2 and the $p^-$-type silicon substrate 1 is gradually changed.

Figure 2:
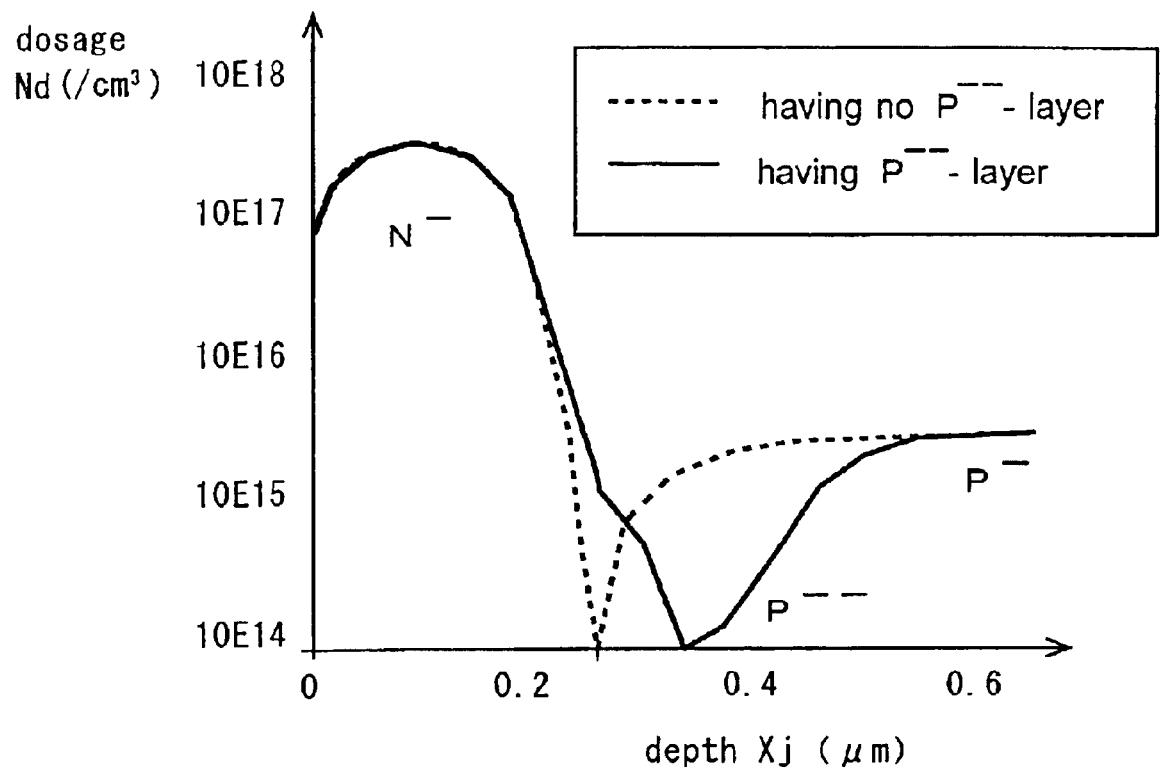
FIG. 2 is a graph showing an impurity profile of the drain region of the MOSFET according to the first embodiment.

FIG. 2 is a graph showing an impurity profile of the drain region of the MOSFET in a depthwise direction. Here, the horizontal axis of the graph represents a depth from the upper surface of the $n^-$-type impurity layer 2; that is, a depth from a boundary surface between the $n^-$-type impurity layer 2 and the gate oxide film 4. Further, the vertical axis represents a dosage. P-type impurity assumes a doping level of $1E14/cm^2$ or thereabouts at a boundary between the $n^-$-type impurity layer 2 and the $p^{---}$-type impurity layer 12. As illustrated, when $p^{---}$-type impurity layer 12 is not formed, the dosage of p-type impurity increases sharply at this boundary. In contrast, in the structure of the MOSFET of the embodiment, the dosage of p-type impurity gradually increases in a depthwise direction.

Figure 3:
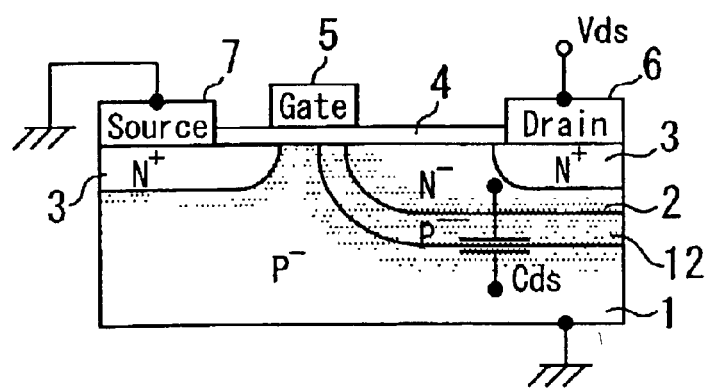
FIG. 3 shows that a drain voltage is applied to the MOSFET according to the first embodiment.

FIG. 3 shows that a drain voltage Vds is applied to the MOSFET. As illustrated, when the drain voltage is applied, a depletion layer is formed in a junction between the $n^-$-type impurity layer 2 and the $p^{---}$-type impurity layer 12. The depletion layer tends to become broader as the dosage becomes lower. As has been described in connection with the profile, the MOSFET of the embodiment has a lower dosage of p-type impurity in the vicinity of the junction between the $n^-$-type impurity layer 2 and the $p^{---}$-type impurity layer 12, and therefore the depletion layer is easily spread.

Figure 4:
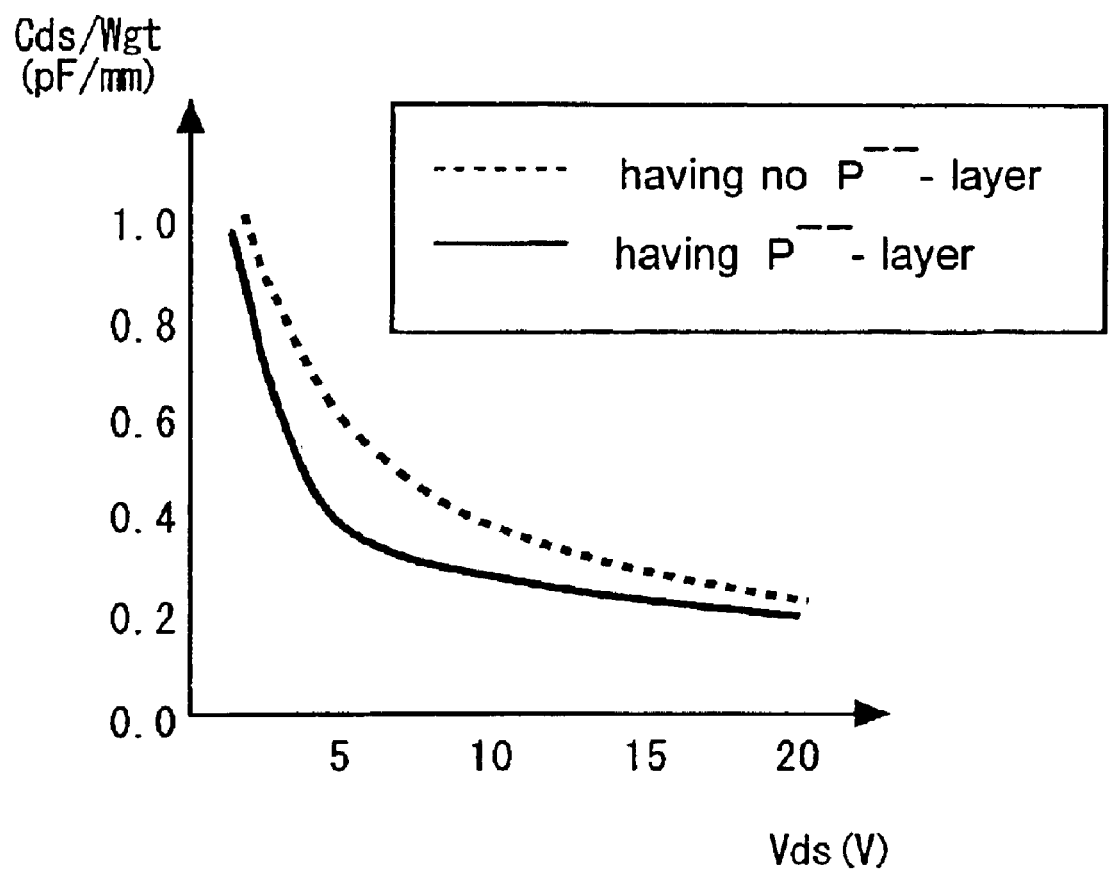
FIG. 4 is a graph showing a relationship between the drain voltage and the substrate capacitance according to the first embodiment.

FIG. 4 is a graph showing a relationship between the drain voltage Vds and the substrate capacitance Cds. The horizontal axis represents a drain voltage. The vertical axis shows capacitance per gate width; Cds/Wgt (Wgt is a gate width). A thick line of the graph shows the case where the $p^{---}$-type impurity layer 12 is provided, whereas broken lines show the case where no $p^{---}$-type impurity layer 12 is provided.

As is evident, the structure of the embodiment is characterized in that a doping level of a junction is low and that a depletion layer is likely to spread. As a drain voltage to be applied becomes higher, the capacitance Cds lowers sharply. For instance, in the case of a drain voltage Vds of 5V, the MOSFET can reduce the capacitance Cds by about 40% when compared with the MOSFET having no $p^{---}$-type impurity layer. As a result of spread of the depletion layer, an electric field developing in the vicinity of the drain region becomes gentle, and hence a breakdown voltage applied between the drain-source area increases.

As illustrated, when the drain voltage Vds exceeds 5V, the change in the capacitance Cds becomes gentle. Even when the drain voltage fluctuates, the capacitance Cds will be stable. In the case of a MOSFET operating at high frequency, the drain voltage usually varies at amplitude which is about three times a supply voltage. Hence, leakage of power to the silicon substrate is likely to develop. In this case, an output of the MOSFET naturally drops. However, the structure of the MOSFET of the embodiment enables suppression of variations in capacitance Cds stemming from variations in the drain voltage. Hence, a high output can be supplied stably.

Second Embodiment

According to the process for manufacturing a MOSFET described in connection with the first embodiment, the p$^{---}$-type impurity layer 12 is formed up to an area located below the gate electrode 5, as shown in FIGS. 1A through 1E. This means that the dosage of an area located immediately below the gate electrode 5; that is, the dosage of a channel existing immediately below the gate electrode 5, is decreased. In general, if the doping level of the channel is decreased, a punch-through phenomenon will be induced by a short channel effect or an increase will arise in drain conductance. The second embodiment provides the structure of a MOSFET for preventing these problems.

The process for manufacturing a MOSFET of the second embodiment will now be described. FIGS. 5A through 5D are views showing the cross section of the MOSFET at primary steps during the course of manufacture of the MOSFET.

Figure 5A:
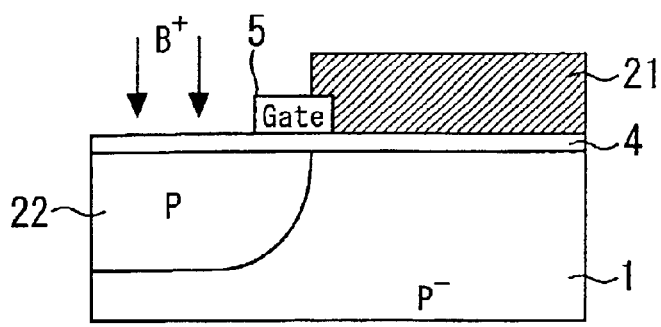
FIGS. 5A, 5B, 5C, and 5D show a manufacturing process for a MOSFET according to a second embodiment of the present invention.

As shown in FIG. 5A, a gate oxide film 4 is formed on the p$^{-}$-type silicon substrate 1, and the gate electrode 5 is formed. Next, the resist pattern 21 is formed so as to cover an area in which a drain region is to be formed and a portion of the gate electrode close to the drain region. Next, p-type impurity is implanted into the area of the wafer which is not covered with the resist pattern 21, thereby forming a p-type impurity layer 22. In the embodiment, boron (B) is implanted as p-type impurity at a dosage of 0.1 to 10E12/cm$^2$ or thereabouts. After implantation of boron, the wafer may be subjected to thermal diffusion, thus diffusing the implanted boron to an area located below the gate electrode 5.

Figure 5B:
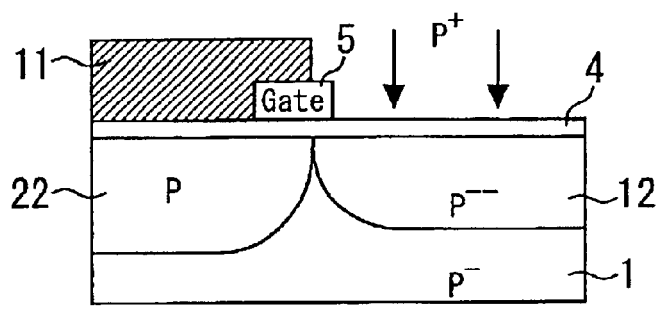
Figure 5C:
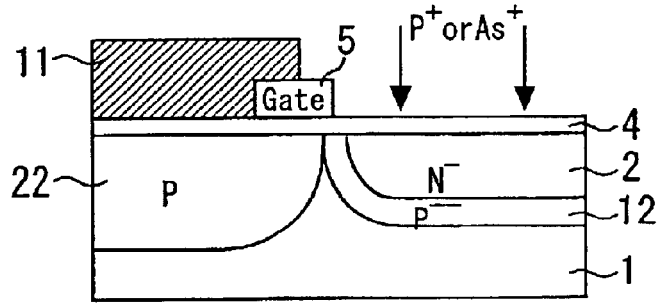

After removal of the resist pattern 21, as shown in FIG. 5B, the resist pattern 11 is formed so as to cover an area where the source area is to be formed and a portion of the gate electrode close to the source region. As in the case of the first embodiment, n-type impurity of low doping level is implanted to such an extent that the polarity of p-type substrate 1 is not inverted. As shown in FIG. 5C, n-type impurity is further implanted, thereby forming an n$^{-}$-type impurity layer 2 in the p$^{---}$-type impurity layer 12.

Figure 5D:
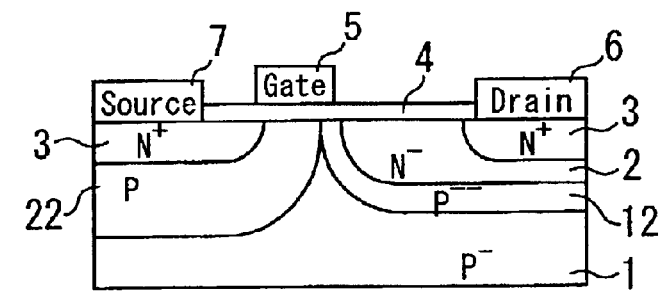
Figure 6:
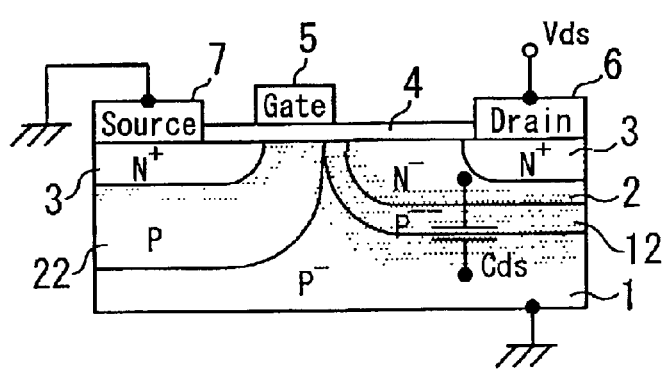
FIG. 6 shows that a drain voltage is applied to the MOSFET according to the second embodiment.

Next, the resist pattern 11 is removed, and, as shown in FIG. 5D, the n$^{+}$-type impurity layer 3, the drain electrode 6, and the source electrode 7 are formed according to the same procedures as those described in connection with the first embodiment. Through the foregoing processes, the MOSFET of the embodiment is completed. The MOSFET differs from that of the first embodiment in that the p-type impurity layer 22 is formed in the source region. The MOSFET is characterized in that the p-type impurity-layer 22 is formed before formation of the p$^{---}$-type impurity layer 12, thereby preventing a significant drop in the dosage of the area located immediately below the gate electrode 5 during the course of formation of the p$^{---}$-type impurity layer 12. In the embodiment, a doping level of an area located below the gate electrode 5 is low. Hence, as shown in FIG. 6, a depletion layer does not spread much in the direction of the gate electrode 5 at the time of application of the drain voltage. In addition to the effect of the first embodiment, there can be yielded an effect of prevention of a punch-through phenomenon.

Third Embodiment

In the process for manufacturing a MOSFET described in connection with the first embodiment, the dosage of the p$^{---}$-type impurity layer 12 is low. Hence, n-type impurity tends to spread up to a position located below the gate electrode 5 during the course of formation of the n$^{-}$-type impurity layer 2. In other words, the width Lov of an overlap between the gate electrode 5 and the n$^{-}$-type impurity layer 2 becomes likely to increase. This is responsible for increasing feedback capacitance Css, which may in turn lower a voltage gain of the MOSFET. The structure of the MOSFET for preventing such a possibility is described in the third embodiment.

Figure 7A:
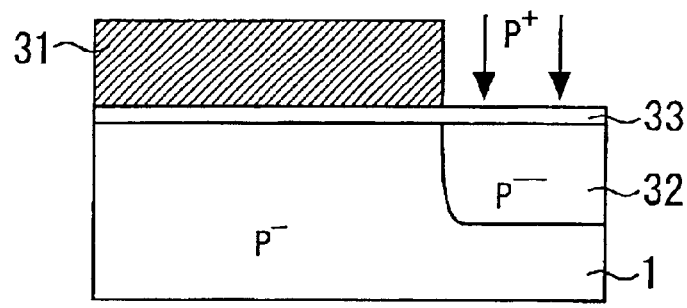
FIGS. 7A, 7B, and 7C show a manufacturing process for a MOSFET according to a third embodiment of the present invention.
Figure 7B:
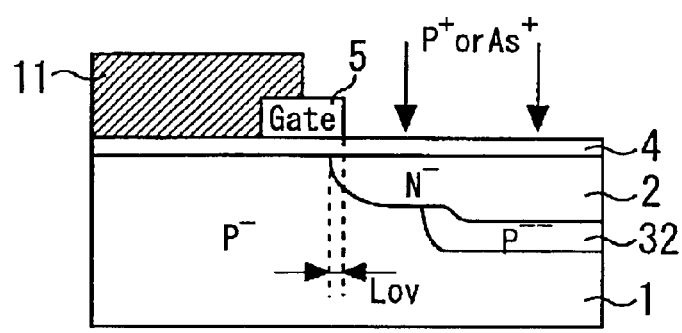
Figure 7C:
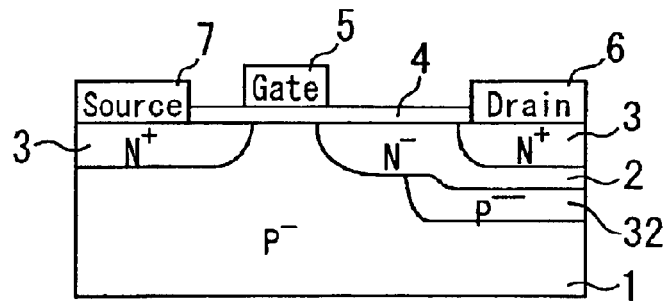

A process for manufacturing the MOSFET of the third embodiment will be described. FIGS. 7A through 7C are cross-sectional views of the MOSFET in the primary steps during the course of manufacture of the MOSFET.

As shown in FIG. 7A, an oxide film 33 is formed on the p$^{-}$-type silicon substrate 1. A resist pattern 31 is formed such that a portion of the area in which the drain region is to be formed is exposed. N-type impurity is implanted into the thus-exposed area at such a low doping level that the polarity of the p$^{-}$-type silicon substrate 1 is not inverted. In the embodiment, phosphorous (P) is implanted as n-type impurity at a dosage of 1 to 5E11/cm$^2$ or thereabouts. As a result, the p$^{---}$-type impurity layer 32 is formed in the p---type silicon substrate 1. The resist pattern 31 and the oxide film 33 are removed after implantation of impurity.

As shown in FIG. 7B, the gate oxide film 4 and the gate electrode 5 are formed on the p$^{-}$-type silicon substrate 1 after removal of the oxide film 33. The resist pattern 11 is formed so as to cover an area in which a source region is to be formed and a portion of the gate electrode 5 close to the source region. As in the case of the first embodiment, n-type impurity is implanted into an area of the wafer which is not covered with the resist pattern 11. In the embodiment, n-type impurity is implanted to a doping level of 1 to 10E12/cm$^2$ or thereabouts. As illustrated, the n$^{-}$-type impurity layer 2 is formed on the p$^{---}$-type impurity layer 32 to a width wider than that of the p$^{---}$-type impurity layer 32.

As shown in FIG. 7C, the resist pattern 11 is removed. The n$^{+}$-type impurity layer 3, the drain electrode 6, and the source electrode 7 are formed according to the same procedures as those described in connection with the first embodiment. The MOSFET of the embodiment is completed through the foregoing process. The MOSFET differs from those fabricated in the other embodiments in that the p$^{---}$-type impurity layer 32 is of narrower width than the n$^{-}$-type impurity layer 2 and is joined to the p$^{---}$-type impurity layer 22 at only a position located below the n$^{-}$-type impurity layer 2. When compared with the first and second embodiments, impurity becomes less likely to diffuse to an area located below the gate electrode 5 during the course of manufacture of the n$^{-}$-type impurity layer 2. Hence, the width Lov of an overlap existing between the gate electrode 5 and the n$^{-}$-type impurity layer 2 becomes smaller (see FIG. 7B).

Figure 8:
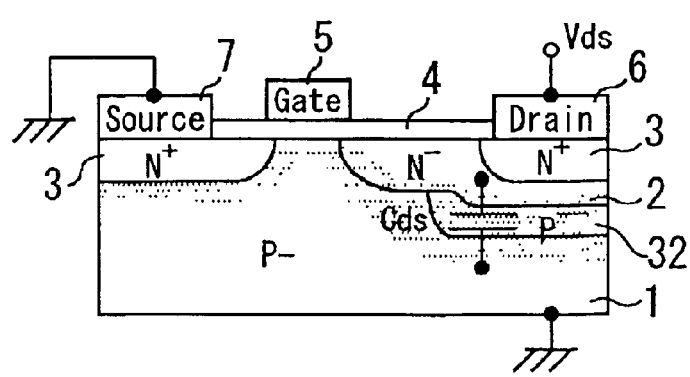
FIG. 8 shows that a drain voltage is applied to the MOSFET according to the third embodiment.

FIG. 8 is a view showing that the drain voltage Vds is applied to the MOSFET. A p$^{---}$-type impurity layer 32 is provided below the n$^{-}$-type impurity layer 2, whereby a depletion layer is easily spread at the time of application of a drain voltage and the capacitance Cds can be made smaller, as in the case of the other embodiments. The width Lov of an overlap existing between the gate electrode 5 and the n$^{-}$-type impurity layer 2 is small, and hence the feedback capacitance Css can also be diminished, thereby improving the operating speed of the MOSFET.

Fourth Embodiment

Figure 9A:
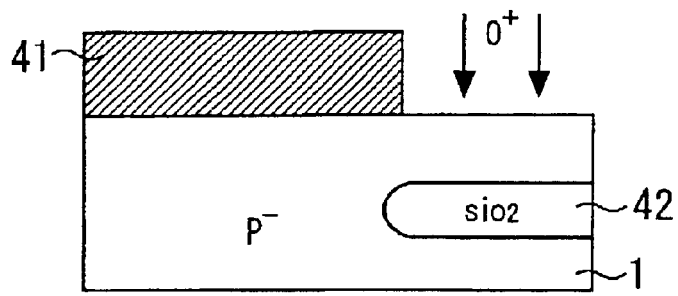
FIGS. 9A and 9B show a manufacturing process for a MOSFET according to a fourth embodiment of the present invention.
Figure 9B:
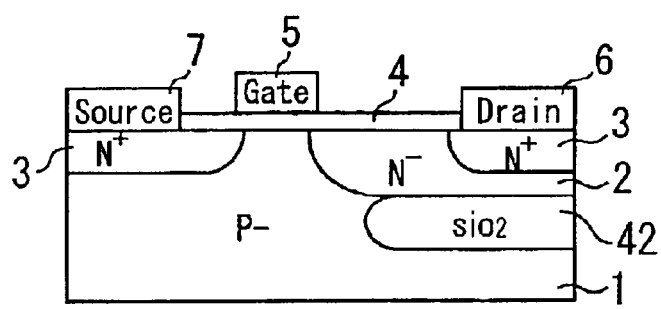

The structure of a MOSFET in which emphasis is placed on prevention of power leakage to an p$^{-}$-type silicon substrate will now be described. First, a process of manufacturing a MOSFET will be described. FIGS. 9A and 9B are views showing the cross section of the MOSFET in the primary steps during the course of manufacture of the MOSFET.

As shown in FIG. 9A, a pattern 41 is formed on the p—type silicon substrate 1 such that a portion of an area in which the drain region is to be formed becomes exposed. As in the case of the other embodiment, a resist pattern may be employed for the pattern 41. However, a pattern having a high ion implantation element capability, such as an oxide film mask or a metal mask, is preferable.

Oxygen (O) ions of high doping level are implanted into the exposed area. In the embodiment, the doping level is 10E18 to/cm² or thereabouts, and the ions are implanted to a depth of about 0.2 to 1.0 μm. The depth of implantation is determined to become deeper than the n⁻-type impurity layer. Subsequently, the wafer is subjected to high-temperature processing. As illustrated, an oxide film (SiO₂) layer 42 is formed in the middle of the p⁻-type silicon substrate 1. When an n⁻-type impurity layer has been formed, the oxide film layer 42 is located at a position immediately below the n⁻-type impurity layer.

As shown in FIG. 9B, the pattern 41 is removed, the gate oxide film 4 is formed on the p⁻-type silicon substrate 1, and the gate electrode 5 is formed on the gate oxide film 4. A resist pattern (not shown) is formed so as to cover an area in which the source region is to be formed and a portion of the gate electrode close to the source region. As a result, as illustrated, the n⁻-type impurity layer 2 is formed on the oxide film layer 42.

Next, the resist pattern is removed, thereby newly forming a resist pattern (not shown) so as to cover the drain region and a portion of the gate electrode close to the drain region. Arsenic is implanted as n-type impurity into an area of the wafer which is not covered with a resist, thereby forming the n⁺-type impurity layer 3. Finally, the drain electrode 6 and the source electrode 7 are formed, thus completing the MOSFET of the embodiment. The structure of the MOSFET is characterized in that the oxide film layer 42 exists in a position located immediately below the n⁻-type impurity layer 2 and in that no p-n junction is present.

Figure 10:
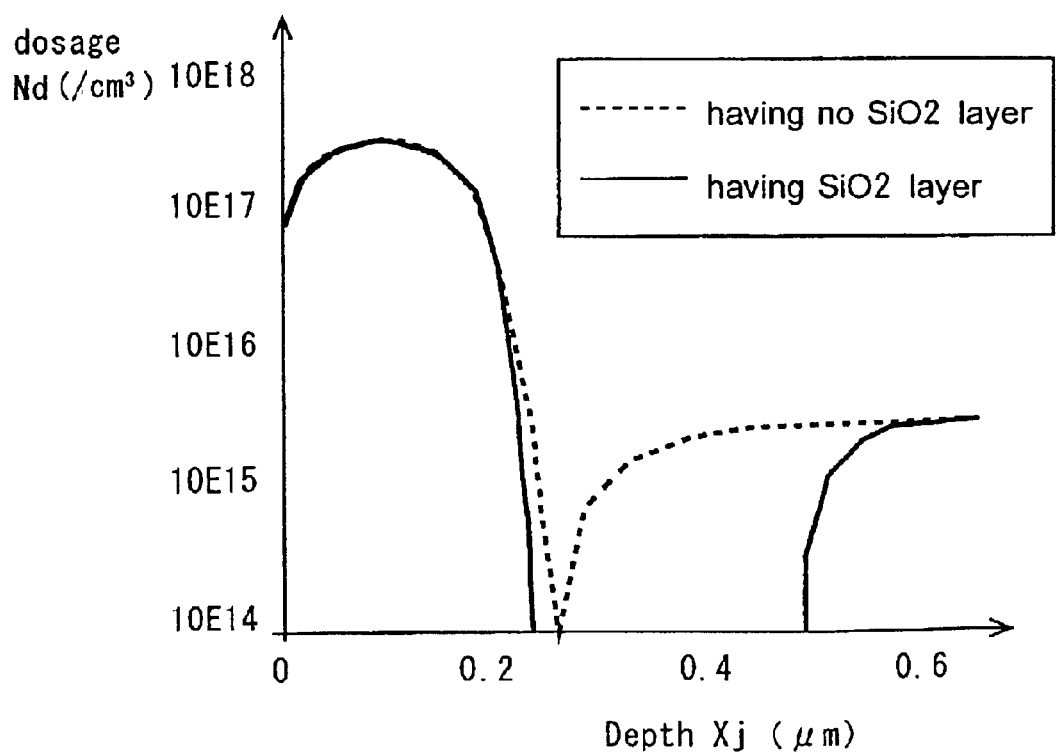
FIG. 10 is a graph showing an impurity profile of the drain region of the MOSFET according to the fourth embodiment.
Figure 11:
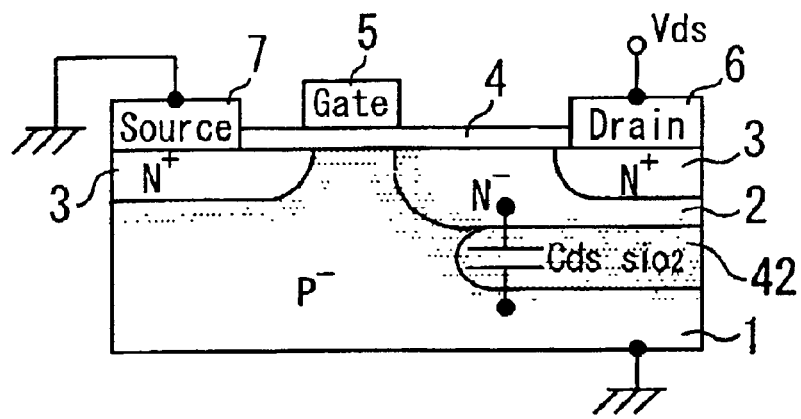
FIG. 11 shows that a drain voltage is applied to the MOSFET according to the fourth embodiment.

FIG. 10 is a graph showing an impurity profile of the drain region of the MOSFET of the embodiment in a depthwise direction. An oxide film layer 42 exists at a position located immediately below the n⁻-type impurity layer 2, and hence a doping level is 0 (i.e., the doping level of that position does not appear on the graph). Therefore, as shown in FIG. 11, the capacitance Cds existing between the n⁻-type impurity layer 2 and the p⁻-type silicon substrate 1 at the time of application of the drain voltage Vds becomes evidently smaller than those obtained in the other embodiments.

Figure 12:
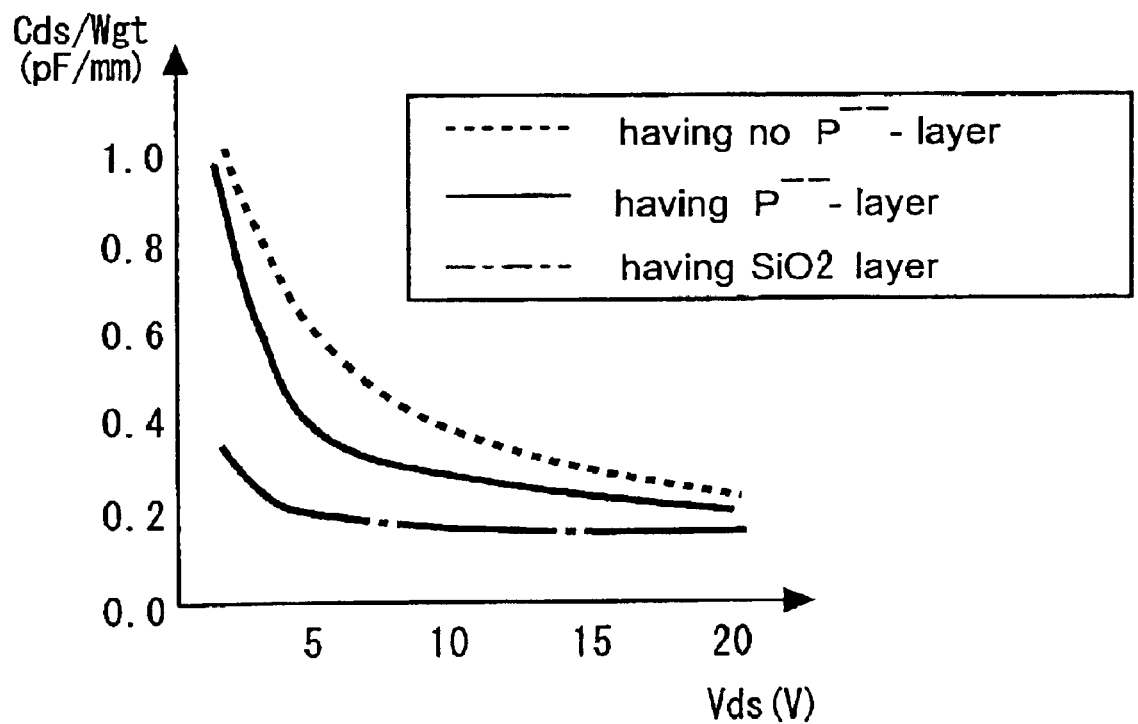
FIG. 12 is a graph showing a relationship between the drain voltage and the substrate capacitance according to the fourth embodiment.
Figure 13:
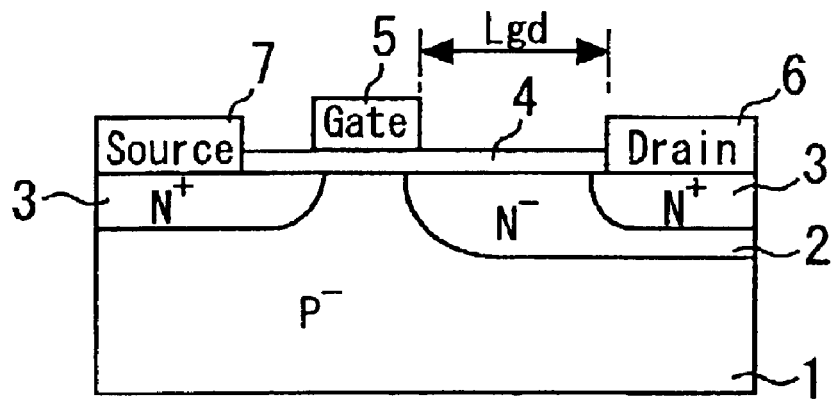
FIG. 13 is a cross-sectional view showing the structure of a conventional MOSFET.
Figure 14:
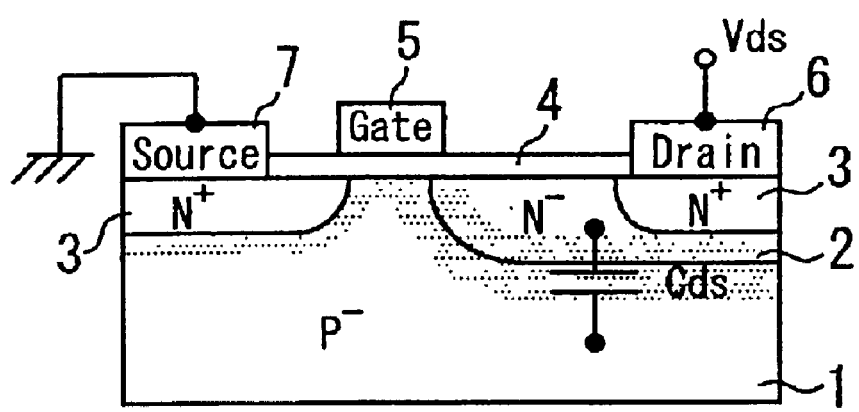
FIG. 14 is a graph showing a relationship between the drain voltage and the substrate capacitance of the conventional MOSFET.

FIG. 12 shows a relationship between the drain voltage Vds and the capacitance Cds arising at the time of application of a drain voltage. When compared with the graph relating to the conventional MOSFET (having no p⁻⁻⁻-type layer) and the graph relating to the MOSFET having the p⁻⁻⁻-type layer of the first embodiment, the graph has two characteristics.

First, the capacitance Cds becomes substantially smaller. In particular, at a drain voltage of 5V, the capacitance Cds developing in the MOSFET of the embodiment has become about 40% smaller than that developing in the MOSFET of the first embodiment, or about 60% smaller than that developing in the conventional MOSFET. Second, it can be seen that the graph becomes more flat as a result of existence of the oxide film layer 42. This means that the capacitance is stable even when a change has arisen in the drain voltage. Consequently, even when the amplitude of the signal is large, leakage of high-frequency power to the p⁻-type silicon substrate can be minimized.

According to the semiconductor device of the present invention, a layer—which is identical in conductivity type with a substrate and lower in doping level than the substrate is provided between a substrate of first conductivity type and an impurity region of second conductivity type which is to become a drain. The layer has a doping profile such that a doping level becomes higher with increasing distance from a junction between the layer and the impurity region of second conductivity type. A doping level of an area located in the vicinity of a p-n junction is made lower, whereby a depletion layer becomes likely to spread at the time of application of a drain voltage. Thus, the capacitance of the drain region can be suppressed to a low level, thus improving an operating speed. Further, variations in the capacitance stemming from variations in a drain voltage become smaller, thereby preventing leakage of power and increasing output efficiency.

It is further understood that the foregoing description is a preferred embodiment of the disclosed device and that various changes and modifications may be made in the invention without departing from the spirit and scope thereof.

The entire disclosure of a Japanese Patent Application No.2002-197454, filed on Jul. 5, 2002 including specification, claims drawings and summary, on which the Convention priority of the present application is based, are incorporated herein by reference in its entirety.

What is claimed is:

1. A semiconductor device comprising:
    a semiconductor substrate having a first conductivity type and a surface;
    source and drain regions having a second conductivity type, opposite the first conductivity type, in the semiconductor substrate, at the surface of the semiconductor substrate; and
    a first impurity region, having the first conductivity type, in the semiconductor substrate, deeper than and having a rectifying junction only with the drain region wherein dopant impurity concentration of the first impurity region increases in the semiconductor substrate with increasing distance from the rectifying junction with the drain region.

2. The semiconductor device according to claim 1, wherein the drain region includes a lightly-doped impurity region joined to the first impurity region and a highly-doped impurity region joining the lightly-doped impurity region, the lightly-doped impurity region being interposed between the highly-doped impurity region and the first impurity region.

3. The semiconductor device according to claim 1, including a second impurity region having the first conductivity type, in the semiconductor substrate in an area where a channel of the semiconductor device is to be formed, the second impurity region having a higher dopant impurity concentration than the semiconductor substrate.

4. The semiconductor device according to claim 3, wherein the second impurity region is contiguous to the first impurity region.

5. The semiconductor device according to claim 1, wherein
    the first impurity region is formed by implantation of a dopant impurity producing the second conductivity type into the semiconductor substrate at a dosage of 1 to 5E11/cm², and
    the drain region is formed by implanting a dopant impurity producing the second conductivity type, at a dosage of 1 to 10E12/cm², into the region in which the dopant impurity producing the second conductivity type has already been implanted.

6. A semiconductor device comprising:
a semiconductor substrate having a first conductivity type and a surface;
source and drain regions having a second conductivity type, opposite the first conductivity type, in the semiconductor substrate at the surface of the semiconductor substrate; and
an oxide film region in the semiconductor substrate, deeper in the semiconductor substrate than the drain region, and having a junction with the drain region but not the source region.

7. The semiconductor device according to claim 6, wherein the drain region includes a lightly-doped impurity region and a highly-doped region joining the lightly-doped impurity region, the lightly-doped impurity region being interposed between the highly-doped impurity region and the oxide film region.

8. The semiconductor device according to claim 1, wherein the first impurity region extends to the surface of the semiconductor substrate and encloses the drain region.

9. A semiconductor device comprising:
a semiconductor substrate having a first conductivity type and a surface;
a first impurity region, having a second conductivity type, opposite the first conductivity type, in the semiconductor substrate, at the surface of the semiconductor substrate, as a drain of the semiconductor device; and
a second impurity region, having the first conductivity type, in the semiconductor substrate, deeper than and having a junction with the first impurity region, and extending to the surface of the semiconductor substrate, and enclosing the first impurity region, wherein
dopant impurity concentration of the second impurity region increases in the semiconductor substrate with increasing distance from the junction with the first impurity region, and
the first impurity region includes a lightly-doped impurity region joining the second impurity region and a highly-doped impurity region joining the lightly-doped impurity region, the lightly-doped impurity region being interposed between the highly-doped impurity region and the second impurity region.

10. The semiconductor device according to claim 9, wherein
the second impurity region is formed by implantation of a dopant impurity producing the second conductivity type into the semiconductor substrate at a dosage of 1 to 5E11/cm², and the first impurity region is formed by implanting a dopant impurity producing the second conductivity type, at a dosage of 1 to 10E12/cm², into the region in which the dopant impurity producing the second conductivity type has already been implanted.

11. A semiconductor device comprising:
a semiconductor substrate having a first conductivity type and a surface;
first and second impurity regions having a second conductivity type, opposite the first conductivity type, in the semiconductor substrate at the surface of the semiconductor substrate, as a source and a drain of the semiconductor device, respectively; and
third and fourth impurity regions, having the first conductivity type, in the semiconductor substrate, respectively enveloping the first and second impurity regions, having respective junctions with the first and second impurity regions, and extending to the surface of the semiconductor substrate at an area where a channel of the semiconductor device is to be formed, wherein
the third impurity region has a higher dopant impurity concentration than the semiconductor substrate, and
the dopant impurity concentration of the fourth impurity region increases in the semiconductor substrate with distance from the junction with the second impurity region.

12. A The semiconductor device according to claim 11, wherein the third impurity region is contiguous to the fourth impurity region.

13. A semiconductor device comprising:
a semiconductor substrate having a first conductivity type and a surface;
a first impurity region having a second conductivity type, opposite the first conductivity type, in the semiconductor substrate, at the surface of the semiconductor substrate, as a drain of the semiconductor device;
a second impurity region, having the second conductivity type, in the semiconductor substrate, enveloping the first impurity region, and extending to the surface of the semiconductor substrate; and
a third impurity region, having the first conductivity type, deeper in the semiconductor substrate than the second impurity region and having a junction with the second impurity region only directly opposite the drain of the semiconductor device, wherein
the dopant impurity concentration of the third impurity region increases in the semiconductor substrate with increasing distance from the junction with the second impurity region.

* * * * *